United States Patent [19]

Furukawa et al.

[11] Patent Number: 4,676,999
[45] Date of Patent: Jun. 30, 1987

[54] METHOD FOR VACUUM DEPOSITION PLATING STEEL STRIP

[75] Inventors: Heizaburo Furukawa; Kanji Wake; Yoshio Shimozato; Kenichi Yanagi; Mitsuo Katoh; Tetsuyoshi Wada, all of Hiroshima; Norio Tsukiji, Sakai; Takuya Aiko, Sakai; Toshiharu Kittaka, Sakai; Yasuji Nakanishi, Sakai, all of Japan

[73] Assignees: Mitsubishi Jukogyo Kabushiki Kaisha; Nisshin Steel Co., Ltd.

[21] Appl. No.: 774,818

[22] Filed: Sep. 11, 1985

[30] Foreign Application Priority Data

Sep. 17, 1984 [JP] Japan .................. 59-192573
Sep. 17, 1984 [JP] Japan .................. 59-192574

[51] Int. Cl.$^4$ .................................. C23C 16/06
[52] U.S. Cl. ............................ 427/250; 118/718; 118/719; 118/733; 427/255.1; 427/255.5
[58] Field of Search ............ 427/250, 255.5, 255.1; 118/733, 718, 719

[56] References Cited

U.S. PATENT DOCUMENTS

| | | | |
|---|---|---|---|
| Re. 24,852 | 8/1960 | Armstrong et al. | 427/250 |
| 2,382,432 | 8/1945 | McManus et al. | 427/250 |
| 2,580,976 | 1/1952 | Toulmin | 118/733 |
| 2,622,041 | 12/1952 | Godley | 427/250 |
| 2,963,001 | 12/1960 | Alexander | 118/733 |
| 2,972,330 | 2/1961 | Bugbee | 118/733 |
| 2,975,753 | 3/1961 | Hayes | 118/733 |
| 3,860,444 | 1/1975 | Donckel et al. | 118/733 |
| 3,957,608 | 5/1976 | Dominique et al. | 427/250 |
| 3,985,281 | 10/1976 | Diepers et al. | 427/250 |
| 4,096,823 | 6/1978 | Schladitz | 427/255.5 |

FOREIGN PATENT DOCUMENTS 2747061 4/1979 Fed. Rep. of Germany ... 427/255.5

Primary Examiner—Sadie L. Childs
Attorney, Agent, or Firm—Toren, McGeady & Associates

[57] ABSTRACT

For vacuum deposition plating steel strip, a vacuum deposition plating apparatus is used including an inlet-side vacuum sealing device provided in front of a vacuum deposition plating chamber, with an inlet-side inactive gas replacement chamber provided between the inlet-side vacuum sealing device and an annealing furnace. An outlet-side vacuum sealing device is provided at the rear of the vacuum deposition plating chamber, with an outlet-side inactive gas replacement chamber provided between the outlet-side vacuum sealing device and the atmosphere. An inactive gas circulating/purifying device circulates an inactive gas from vacuum chambers of both the vacuum sealing devices to atmospheric pressure chambers of both the vacuum sealing devices and removes water, oil and oxygen from the inactive gas. Oxygen and hydrogen in the inactive gas are regulated to provide 60 ppm or less of oxygen and 0.2 to 2.0% of hydrogen, and also to regulate the dew point of the inactive gas to $-50°$ C. or less. Further, a pressure $P_1$ in the annealing furnace, a pressure $P_2$ in the inlet-side inactive gas replacement chamber, and a pressure $P_3$ in the outlet-side inactive gas replacement chamber are maintained at atmospheric pressure or more. A value of $P_1-P_2$ can be kept at 0 mmAq or more, and the concentration of hydrogen in the inlet-side inactive gas replacement chamber is held to 2.0° or less.

2 Claims, 16 Drawing Figures

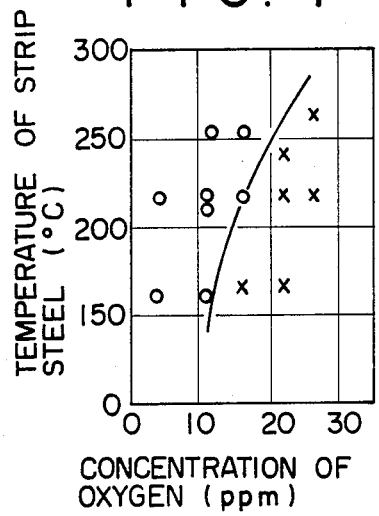
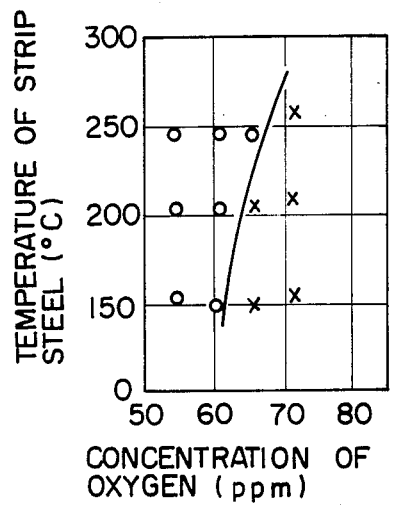
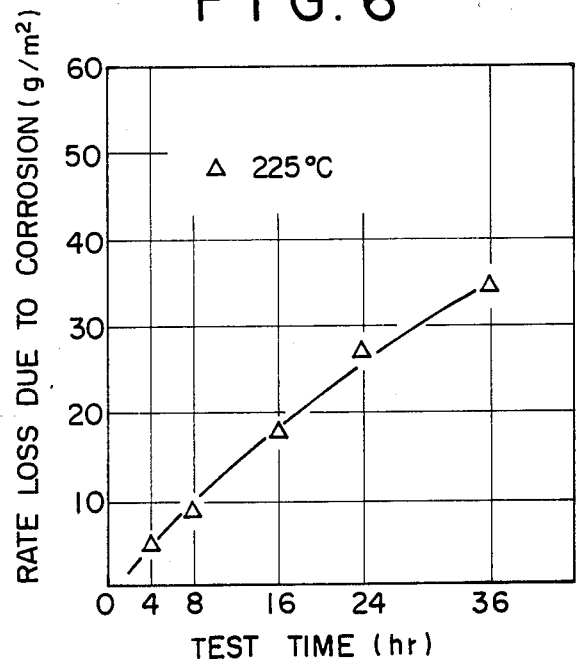

METHOD FOR VACUUM DEPOSITION PLATING STEEL STRIP

The present invention relates to a method of vacuum deposition plating steel strip.

With regard to means for vacuum deposition plating, for the purpose of preventing the invasion of dust and the like into a vacuum chamber from the atmosphere, it has been suggested that means for gradually reducing a pressure in the vacuum chamber from atmospheric pressure is provided so as to stepwise form vacuum conditions and that a chamber containing an inactive gas atmosphere is disposed between an annealing furnace and the vacuum chamber (Japanese Patent Publication No. 6576/1969 and Japanese Patent Provisional Publication No. 85742/1978).

In carrying out the vacuum deposition plating, an adhesive strength of a plated metallic coating on a strip steel must be such that peeling, cracking and powdering do not occur, even if subjected to rigorous works such as 180° ot-bending work, reverse rethrottle bending work and the like. In order to satisfy this requirement, the strip steel is annealed and reduced in a hydrogen gas atmosphere ($H_2 = 5$ to 75%), so that the surface of the strip steel is activated, whereby when the vacuum deposition plating is carried out on the activated surface, the sufficient adhesive strength can be given to the plated metallic coating. That is to say, if the strip steel is guided to a vacuum deposition chamber via a vacuum chamber while in the activated surface state, the above-mentioned object can be achieved.

The conventional suggestion just described aims at preventing dusts and the like from invading the vacuum chamber by providing a high-pressure chamber, but such a constitution alone cannot provide such vacuum plated products as are desired above. That is to say, when the annealing furnace (having atmospheric pressure +5 to 10 mmAq) in which the strip steel is annealed and reduced is directly connected with the vacuum chamber, a hydrogen gas ($H_2 = 5$ to 75%) in the annealing furnace is discharged therefrom by vacuum. In the event that the vacuum chamber is broken and air (oxygen gas) invades the vacuum chamber, an explosion might come about. Accordingly, the suggested concept cannot be utilized in industrial fields.

For this reason, the following other measures have been taken: A nitrogen replacement chamber is disposed between the anealing furnace and the vacuum chamber, and a nitrogen gas ($N_2$ gas) is introduced into the nitrogen replacement chamber to replace the hydrogen gas with the nitrogen gas therein, whereby the $N_2$ gas is discharged by vacuum and thus the danger of the explosion can be avoided. In this conventional method, however, the $N_2$ gas is discharged out of the system in vain, which fact leads to the increase in material costs disadvantageously.

Accordingly, an object of the present invention is to provide a vacuum deposition plating method capable of solving the above-mentioned problems without impairing functions inherent in an annealing furnace and a vacuum chamber and a vacuum deposition plating apparatus for performing the new method.

That is to say, the present invention is concerned with a method for vacuum deposition plating which comprises using a vacuum deposition plating apparatus having an inlet-side vacuum sealing device provided in front of a vacuum deposition plating chamber, an inlet-side inactive gas replacement chamber provided between the inlet-side vacuum sealing device and an annealing furnace, an outlet-side vacuum sealing device provided in the rear of the vacuum deposition plating chamber, an outlet-side inactive gas replacement chamber provided between the outlet-side vacuum sealing device and the atmosphere, and an inactive gas circulating/purifying device for circulating an inactive gas from vacuum chambers of both the vacuum sealing devices to atmospheric pressure chambers of both the vacuum sealing devices and for removing water, oil and oxygen from the inactive gas, said method for vacuum deposition plating being characterized by regulating concentrations of oxygen and hydrogen in the inactive gas after the purification to 60 ppm or less and 0.2 to 2.0%, respectively, and regulating a dew point of the inactive gas to $-50°$ C. or less.

Further, the present invention is concerned with a method for vacuum deposition plating which comprises using a vacuum deposition plating apparatus having an inlet-side vacuum sealing device provided in front of a vacuum deposition plating chamber, an inlet-side inactive gas replacement chamber provided between the inlet-side vacuum sealing device and an annealing furnace, an outlet-side vacuum sealing device provided in the rear of the vacuum deposition plating chamber, an outlet-side inactive gas replacement chamber provided between the outlet-side vacuum sealing device and the atmosphere, and an inactive gas circulating/purifying device for circulating an inactive gas from vacuum chambers of both the vacuum sealing devices to atmospheric pressure chambers of both the vacuum sealing devices and for removing water, oil and oxygen from the inactive gas, the aforesaid method for vacuum deposition plating being characterized by regulating a pressure $P_1$ in the annealing furnace to atmospheric pressure or more, a pressure $P_2$ in the inlet-side inactive gas replacement chamber to atmospheric pressure or more, a pressure $P_3$ in the outlet-side inactive gas replacement chamber to atmospheric pressure or more, a value of $P_1 - P_2$ to 0 mmAq or more, and a concentration of hydrogen in the inlet-side inactive gas replacement chamber to 2.0% or less, respectively.

Furthermore, the present invention is concerned with a vacuum deposition plating apparatus characterized by comprising an inlet-side vacuum sealing device provided in front of a vacuum deposition plating chamber; an inlet-side inactive gas replacement chamber provided between the inlet-side vacuum sealing device and an annealing furnace; an outlet-side vacuum sealing device provided in the rear of the vacuum deposition plating chamber; an outlet-side inactive gas replacement chamber provided between the outlet-side vacuum sealing device and the atmosphere; an inactive gas circulating/purifying device for circulating an inactive gas from vacuum chambers of both the vacuum sealing devices to atmospheric pressure chambers of both the vacuum sealing devices and for removing water, oil and oxygen from the inactive gas; a pressure gauge provided on the annealing furnace; a pressure gauge, a control valve, an automatic valve, a hydrogen concentration detector and a discharge valve provided on the inlet-side inactive gas replacement chamber; a pressure gauge and an automatic valve provided on the outlet-side inactive gas replacement chamber; and an automatic valve connecting to an inactive gas tank for emergency provided on the atmospheric pressure chambers of both the vacuum sealing devices.

Concretely speaking of the present invention, the nitrogen replacement chamber is provided between the annealing furnace and the vacuum sealing device, and the sealing rolls are provided between the annealing furnace and the nitrogen replacement chamber and between the nitrogen replacement chamber and the vacuum sealing device. These sealing rolls are manufactured like sealing rolls used in the vacuum sealing device. A pressure in the annealing furnace is regulated so as to be equal to or a little higher than that in the nitrogen replacement chamber. For example, when the pressure in the furnace is equal to that in the chamber, the hydrogen gas does not flow from the annealing furnace to the nitrogen replacement chamber and thus there is no danger of increasing an amount of hydrogen in the nitrogen replacement chamber and bringing about an explosion. In addition thereto, a poor annealing and reduction can be avoided, because no nitrogen gas flows from the nitrogen replacement chamber to the annealing furnace and because conditions of the atmosphere gas ($H_2 = 5$ to 75%, $N_2 = 95$ to 25%) in the annealing furnace are retained suitably.

The above-mentioned sealing rolls used in the present invention are constituted so that a space area between each pair of rolls through which the gas passes may be extremely small. That is to say, the sealing rolls have a gas tight structure, and thus a flow rate of the gas is low even under chock conditions (when a pressure ratio of a low pressure/a high pressure is 0.52 or less). Therefore, when the pressure in the annealing furnace is equal to that in the nitrogen replacement chamber, the gas does not flow anywhere. Even when the pressure in the annealing furnace is slightly higher than that in the nitrogen replacement chamber and a differential pressure occurs therebetween, the amount of the leaked gas is so small as to be negligible. The hydrogen gas diffuses into the nitrogen replacement chamber through a narrow space between the rolls. Similarly, the nitrogen gas also moves into the annealing furnace diffusely.

The strip steel which has been annealed and reduced in the annealing furnace has an active surface for enabling the vacuum deposition plating. In order to prevent the activity on the strip steel from being impaired in the nitrogen replacement chamber, it is preferred that the hydrogen gas is allowed to diffuse into the nitrogen replacement chamber. Thus, the pressure in the annealing furnace is regulated to a little higher level than that in the nitrogen replacement chamber so that a small amount of the hydrogen gas may be allowed to leak into the nitrogen replacement chamber, whereby an amount of hydrogen in the nitrogen replacement chamber is adjusted to 2.0% or less, preferably 0.2 to 2.0%, in order to prepare a weakly reductive atmosphere.

In this case, it is desirable that a concentration of oxygen in the purified inactive gas and its dew point are controlled to 60 ppm or less and $-50°$ C. or less, respectively.

When a concentration of hydrogen in the nitrogen replacement chamber is in excess of 2.0%, in other words, when it reaches a certain level at which an explosion tends to occur, the nitrogen gas will be introduced into the nitrogen replacement chamber to lower the hydrogen concentration, and when the pressure in the nitrogen replacement chamber rises, the atmosphere gas comprising the nitrogen gas and the hydrogen gas will be discharged therefrom through a discharge valve, whereby an amount of the hydrogen gas in the nitrogen replacement chamber is controlled to 2.0% or less, preferably 0.2 to 2.0%.

In the method of the present invention, the pressure $P_1$ in the annealing furnace is regulated to atmospheric pressure or more. The reason for such a regulation is that the atmosphere gas in the annealing furnace comprises 5 to 75% of hydrogen and 95 to 25% of nitrogen and is in danger of an explosion when oxygen (air) invades the annealing furnace, and thus it is required to prevent the atmosphere from invading the annealing furnace. Generally speaking, it is preferred that the pressure $P_1$ is adjusted to a level of atmospheric pressure $+5$ mmAq. For example, if a non-oxidizing furnace (NOF) for heating an inlet of the annealing furnace with a direct-fired burner is suitably provided, a pressure resulting from a burned waste gas can be obtained. That is to say, since the atmosphere gas is always fed to the annealing furnace, the pressure in the whole annealing furnace can be maintained at a level of atmospheric pressure $+5$ mmAq.

A pressure $P_2$ in the inlet-side inactive gas replacement chamber is regulated to atmospheric pressure or more in order to inhibit the invasion of air, and in view of the pressure $P_1$ in the annealing furnace being atmospheric pressure $+5$ mmAq, the pressure $P_2$ in the inlet-side inactive gas replacement chamber preferably is atmospheric pressure $+5$ to 4 mmAq. In this way, the flow of the atmosphere gas containing 5 to 75% of hydrogen and 95 to 25% of nitrogen into the replacement chamber is accomplished, so that a concentration of hydrogen in the atmosphere gas in the replacement chamber is adjusted to 2.0% or less, preferably 0.2 to 2.0%, and so that a concentration of nitrogen therein is controlled within the range of 99.8 to 98%.

Further, in the method of the present invention, the pressure $P_3$ in the outlet-side inactive gas replacement chamber is regulated to atmospheric pressure, preferably atmospheric pressure $+5$ mmAq. Such a regulation is for the prevention of the invasion of air, but particularly in the present invention, it is for the acquisition of the following functional effects:

A first effect is to restrain the invasion of air into the inactive gas purification system. Further, when a one-side plating is carried out for the strip steel, oxidation (bluing) will occur on non-plated surfaces of the products in the event that air (oxygen) is present in the outlet-side inactive gas replacement chamber. Therefore, a second effect of the above-mentioned constitution is to prevent such an oxidation (additionally, the outlet-side inactive gas replacement chamber also functions to cool the strip steel).

The relation between the pressures $P_1$ and $P_2$ is regulated to $P_1 - P_2 \geqq 0$ mmAq. This means that $P_1$ and $P_2$ each are atmospheric pressure or more, and $P_1 \geqq P_2$. Preferably, $P_1$ is the atmospheric pressure $+5$ mmAq. When the hydrogen gas flows from the annealing furnace to the inlet-side inactive gas replacement chamber and the concentration of hydrogen is in excess of 2.0%, the nitrogen gas will be introduced into the replacement chamber in order to dilute the hydrogen concentration. When $P_1 - P_2 < 0$, control means works to open the discharge valve so as to maintain $P_1 - P_2 \geqq 0$.

The above-mentioned and other objects and features of the present invention will become apparent from the following description in reference to accompanying drawings, in which:

FIGS. 4 and 5 are graphs showing adhesive strengths of vacuum zinc plated products;

FIG. 6 is a graph showing results of brine spray anti-corrosive tests for vacuum zinc plated products under conditions of changing temperatures of strip steels;

Figure 9:
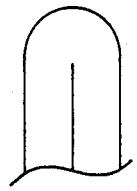

FIGS. 8 (A)(a) to 8 (D)(b) are photomicrographs exhibiting crystalline structures on the surfaces of zinc plated products according to a variety of plating methods and crystalline structures thereon after ot-bending tests; and FIG. 9 is a view showing a bending manner of the ot-bending tests in FIG. 8.

Now, the present invention will be described in detail in reference to FIGS. 1, 2 and 3.

Figure 1:
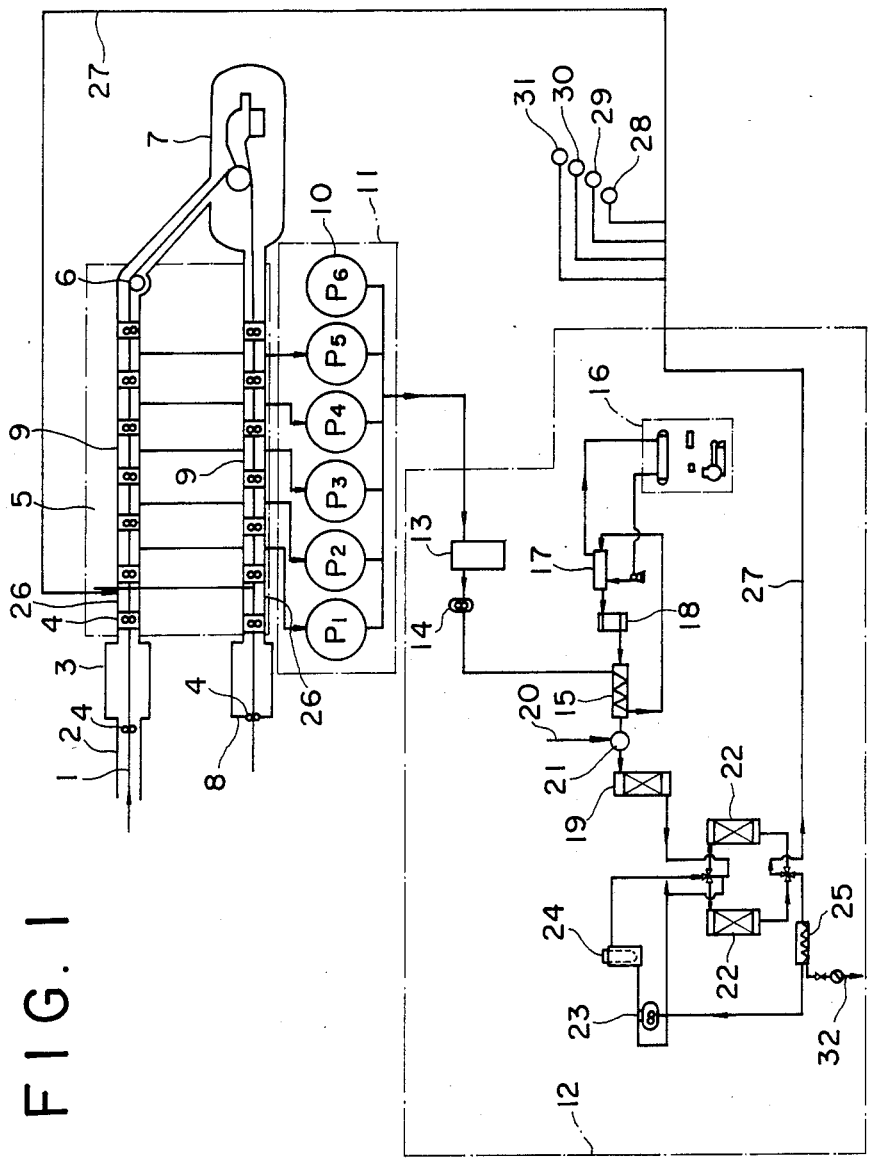
FIGS. 1 and 2 show one embodiment of the present invention.

In FIG. 1, a strip steel 1 is annealed and reduced with a hydrogen gas ($H_2 = 5$ to $75\%$) in an annealing furnace 2, and is then introduced into a nitrogen replacement chamber 3 while the activated surface of the strip steel 1 is maintained. Next, it is delivered through a vacuum sealing device 5 comprising a plurality of sealing rolls 4, and at this time, it passes through a high-vacuum atmosphere in the vacuum sealing device 5 in which a pressure is gradually diminished. The strip steel 1 is then forwarded, via a turn down roll 6, to a vacuum deposition chamber 7, where a molten metal (not shown) evaporates and the strip steel 1 is plated with the molten metal. Afterward, the strip steel 1 is guided into the atmosphere through the vacuum sealing device 5 again and a nitrogen replacement chamber 8.

The above-mentioned vacuum sealing device 5 has a plurality of sealing rolls 4 and vacuum chambers 9, and the respective vacuum chambers 9 are evacuated by a plurality of vacuum pumps 10 in a vacuum evacuation system 11.

The nitrogen replacement chamber 3, the vacuum sealing device 5, the vacuum deposition chamber 7 and the nitrogen replacement chamber 8 are filled with a nitrogen gas.

The nitrogen gas which has been discharged from the vacuum chambers 9 by virtue of vacuum is delivered from the vacuum evacuation system 11 to a nitrogen purification system 12. The nitrogen gas introduced into the nitrogen purification system 12 is then forwarded, via a buffer tank 13 and a Roots-blower 14, to a heat exchanger 15, in which it is cooled. In a cooling device 17 comprising a refrigerator and containing a refrigerant, the nitrogen gas is further cooled to remove moisture therefrom. In an oil remover 18, an oil is removed from the nitrogen gas, and the latter is then heated during passing through a heat exchanger 15 again and is delivered to an acid removing tower 19 via a mixer 21.

For the purpose of removing oxygen from the nitrogen gas, a hydrogen gas is introduced into the mixer 21 and is mixed with the nitrogen gas therein. The removal of oxygen is carried out by the function of a catalyst present in the acid removing tower 19, and the oxygen-free nitrogen gas is then delivered to a drier 22, in which moisture is further removed therefrom, so that a dew point of the nitrogen gas is lowered, thereby obtaining the purified nitrogen gas.

Two driers may be provided if necessary, and in this case, one drier may be operated to lower the dew point of the nitrogen gas, and the other drier may be at rest and during this rest, moisture in the other drier may be eliminated therefrom for its recovery.

In this recovery operation, a part of a gas discharged from the acid removing tower 19 may be used as a gas for the recovery. The nitrogen gas containing moisture is delivered from the drier 22 to a cooling device 25, in which moisture is removed therefrom. Further, the nitrogen gas is forcedly delivered by a Roots-blower 23 to a heater 24, in which it is dried, and it is further forwarded to the drier 22 in which moisture is removed therefrom. In this way, the fluid is continuously circulated through a recovery circulation passage of the respective equipments for the recovery in order to recover the drier now resting. Thus, the recovered drier can be exchanged for the drier now operating, which fact permits a continuous operation of the nitrogen purification system. Moreover, the water collected in the cooling device 25 is discharged from the system through a drain (having a check valve) 32.

The nitrogen gas 27 which has been purified in the nitrogen purification system 12 is delivered to an atmospheric pressure chamber 26 in the vacuum sealing device, and it is caused to flow through the respective stepwise sections in the vacuum sealing device 5 and is then discharged through the vacuum evacuation system 11 again. That is to say, the nitrogen gas 27 is circulated through a closed cycle.

In the nitrogen purification system 12 just described, the water content, the oxygen concentration and the temperature of the nitrogen gas are automatically controlled by a moisture meter 28, an oxygen meter 29 and a thermometer 30, respectively, so that the oxygen concentration and the dew point are regulated to about 10 ppm or less and about $-50°$ C. or less, respectively.

The purified nitrogen gas is brought into contact with the strip steel 1 during passing through the vacuum sealing device 5.

The strip steel 1 is reduced and activated with the hydrogen gas ($H_2 = 5$ to $75\%$) in the annealing furnace 2 in order to render the surface thereof platable. If it is intended that the strip steel 1 is guided through the vacuum deposition chamber 7 while keeping the steel surface platable, the purified nitrogen gas must be made weakly reductive, since the merely purified nitrogen gas is insufficient as the gas to be used. For this purpose, an excessive amount of the hydrogen gas is introduced into the mixer 21 so as to control the concentration of the hydrogen gas within the range of 0.2 to 2.0% by the use of a hydrogen meter 31.

In the above-mentioned invention, the lower the concentration of oxygen in the inactive gas, the better, and when the oxygen content is in excess of 60 ppm, adhesive properties of a plated layer will be poor. Further, the higher the concentration of hydrogen, the better, but when the hydrogen content is in excess of 2.0%, a hydrogen explosion will tend to occur in the event that the vacuum condition of the system is broken and air invades it. Furthermore, the lower the dew point, the better, and when the dew point is too high, the adhesive properties of the plated layer will be poor. That is the reason why the upper limit of the dew point is set to $-50°$ C.

Figure 2:
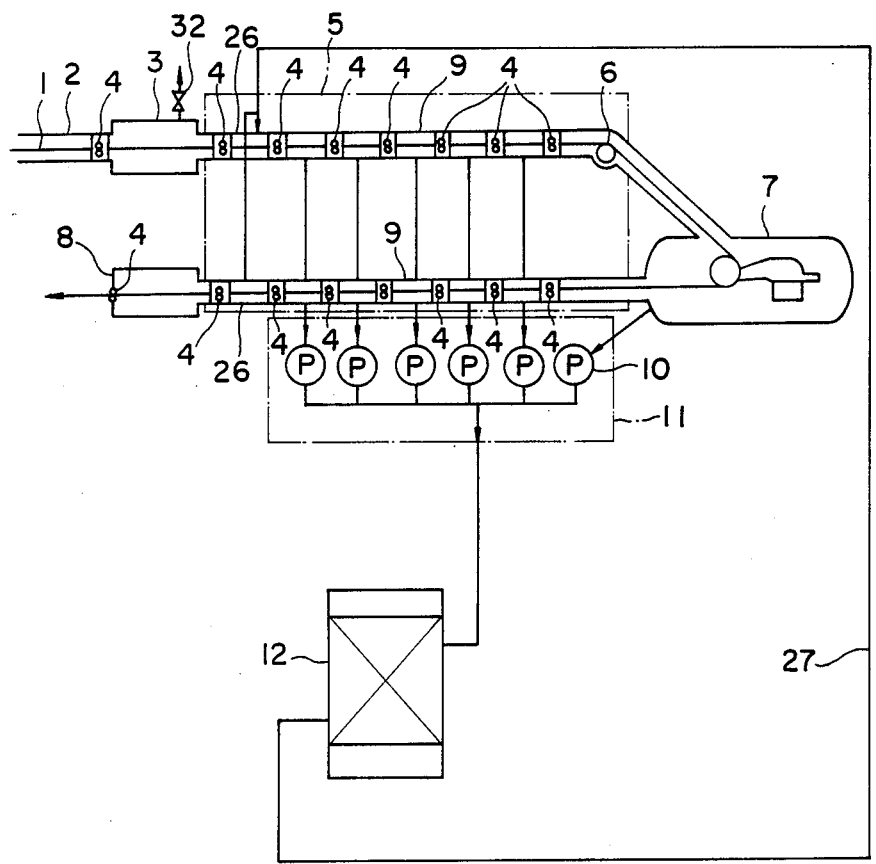

In FIG. 2, the strip steel 1 is annealed in the annealing furnace 2 and is reduced in the atmosphere of the hydrogen gas ($H_2 = 5$ to $75\%$, $N_2 = 95$ to $25\%$), and is then introduced into the inactive gas replacement chamber (hereinafter referred to as the nitrogen replacement chamber) 3 having the sealing rolls 4 in front of and in the rear of it.

The atmosphere gas in the nitrogen replacement chamber 3 is controlled to the weakly reductive state with the hydrogen gas ($H_2=2.0\%$ or less, preferably $H_2=0.2$ to 2.0%). Afterward, the strip steel 1 is guided to the vacuum sealing device 5 comprising a plurality of the sealing rolls 4, a plurality of the vacuum chambers 9 and an atmospheric pressure chamber 26, and is then delivered to the vacuum deposition chamber 7 via the turn down roll 6. In the vacuum deposition chamber 7, the strip steel 1 is plated with the molten metal (not shown). The strip steel 1 is then delivered through the vacuum sealing device 5 again, and is guided from the deposition device system to the atmosphere through the outlet-side nitrogen replacement chamber 8.

On the other hand, the nitrogen gas discharged from the respective vacuum chambers 9 by the vacuum evacuation system 11 comprising a plurality of vacuum pumps 10 is then delivered to the nitrogen purification system 12, in which moisture, an oxygen gas and an oil are removed from the discharged nitrogen gas. For the sake of changing this purified nitrogen gas into a weakly reductive atmosphere gas, the hydrogen gas is introduced into the system so that a concentration of hydrogen may be 2.0% or less, preferably within the range of 0.2 to 2.0%. The thus obtained reductive atmosphere gas is fed to the atmospheric pressure chamber 26 in the vacuum sealing device 5 again. As is apparent from the aforesaid description, a circulating cycle comprising the vacuum chamber 9, the nitrogen purification system 12, the atmospheric pressure chamber 26 and the vacuum chambers 9 is established for the nitrogen gas.

Figure 3:
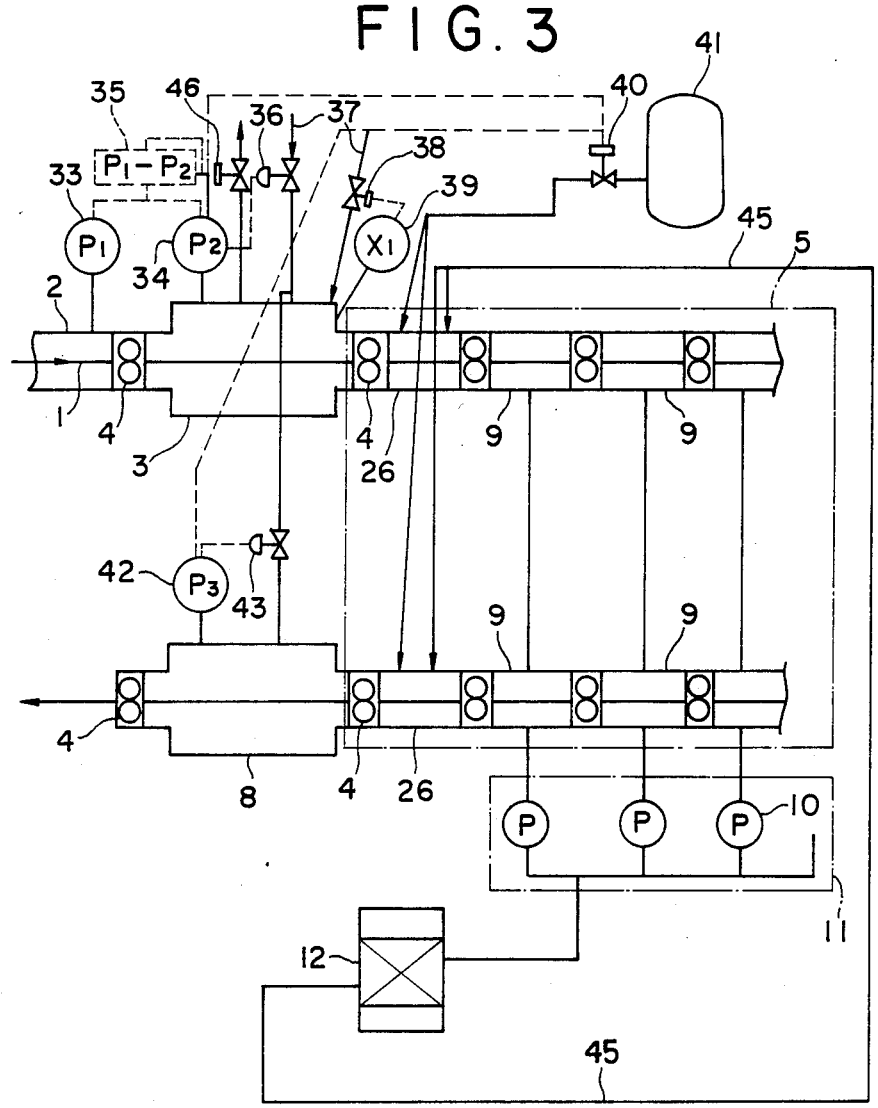
FIG. 3 is a view detailedly illustrating an essential portion of FIG. 2.

In the apparatus shown in FIG. 3, a pressure $P_1$ in the annealing furnace 2 is detected by a pressure gauge 33, and a pressure $P_2$ in the nitrogen replacement chamber 3 is detected by a pressure gauge 34. The nitrogen gas with which the vacuum sealing device 5 and the vacuum deposition chamber (not shown) have been filled at an early stage is discharged therefrom by the vacuum evacuation system 11 comprising the vacuum pumps 10. And it is afterward purified in the nitrogen purification system 12, is returned to the atmospheric pressure chamber 26 in the vacuum sealing device 5 through a pipe 45, and is discharged therefrom via the vacuum chambers 9 again. At this time, a differential pressure ($P_2-P_1 \leq 0$ mmAq) between the pressure $P_2$ in the nitrogen replacement chamber 3 and the pressure $P_1$ in the annealing furnace is eliminated by discharging the excessive nitrogen gas from a discharge valve 46 into the atmosphere.

In the vicinity of the sealing roll 4 on the side of the annealing furnace 2, there is disposed a feed line (not shown) for the annealing furnace atmosphere gas ($H_2=5$ to 75%, $N_2=95$ to 25%), and the pressure $P_1$ in the annealing furnace 2 is controlled by the feed line so as to be at a level of atmospheric pressure or more, preferably atmospheric pressure +5 mmAq.

The pressure $P_2$ in the nitrogen replacement chamber 3 is controlled so as to be atmospheric pressure or more, preferably atmospheric pressure +4 to 5 mmAq. This control is made by operating a control valve 36 in accordance with a signal from the pressure gauge 34 and feeding the nitrogen gas 37 to the nitrogen replacement chamber 3.

On the other hand, when a concentration of the hydrogen gas which has penetrated from the annealing furnace 2 into the nitrogen replacement chamber 3 is in excess of 2.0%, an explosion will tend to occur. For the prevention of the explosion, a hydrogen concentration detector 39 operates when the hydrogen concentration exceeds 2.0%, and an automatic valve 38 is brought into action in turn, whereby the nitrogen gas 37 is introduced into the nitrogen replacement chamber 3 to dilute the concentration of hydrogen. In this case, when the concentration of hydrogen is 1.0% or less, the automatic valve 38 is closed. Further, when a differential pressure ($P_2-P_1$) between the pressures $P_2$ and $P_1$ is 0 mmAq or less, a discharge valve 46 allows the excessive atmosphere gas in the nitrogen replacement chamber 3 to be discharged therefrom into the atmosphere.

A pressure $P_3$ in the nitrogen replacement chamber 8 provided on the outlet side of the vacuum sealing device 5 is detected by a pressure gauge 42, and its control is made by feeding the nitrogen gas 17 to the nitrogen replacement chamber 8 through the automatic valve 43 so that the pressure $P_3$ may be at a level of atmospheric pressure, preferably atmospheric pressure +5 mmAq.

Moreover, when the pressure $P_2$ in the nitrogen replacement chamber 3 is less than atmospheric pressure, for example, atmospheric pressure $-5$ mmAq, or when the pressure $P_3$ in the nitrogen replacement chamber 8 is less than atmospheric pressure, for example, atmospheric pressure $-5$ mmAq owing to a certain cause in the vacuum sealing device 5, an automatic valve 40 is opened in order to feed the nitrogen gas from an emergency nitrogen tank 41 to the vacuum sealing device 5 and to thereby restore the pressure in the atmospheric pressure chamber 26 to the atmospheric pressure. This constitution prevents the concentrated hydrogen gas from flowing from the annealing furnace 2 into the circulating system, and also prevents the oxygen gas from flowing from the atmosphere into the outlet-side nitrogen replacement chamber 8 and the oxygen gas from invading the circulating system. After all, the explosion of the whole apparatus is obviated beforehand and security is thus assured.

The security of the safe nitrogen replacement chambers 3 and 8 and the adjustment of the pressures therein to the desired levels can be accomplished only by providing the gas tight sealing rolls 4. As these sealing rolls 4, known ones can be used.

Now, the present invention will be described in detail in reference to embodiments.

Embodiment 1

| | |
|---|---|
| Thickness of strip steel | 0.8 mm |
| Width of strip steel | 300 mm |
| Feed rate of steel | 20 m/min |
| Vacuum steps and vacuum degree in vacuum sealing device | |
| 200 Torr/70 Torr/10 Torr/1 Torr/0.1 Torr/0.01 Torr | |
| Vacuum evacuation volume | 780 Nm³/h |
| Component properties of gas at inlet of nitrogen purification system: | |
| Conc. of oxygen | 270 ppm |
| Feed rate of oil | 1 cc/hr |
| Feed rate of water | 203 kg/hr |

Under the above-mentioned conditions, a circulating purification was carried out, and an outlet gas having the following component properties was obtained:

| Component properties of gas at outlet of nitrogen purification system: | |
|---|---|
| Conc. of oxygen | 0.7 to 60 ppm |

| Component properties of gas at outlet of nitrogen purification system: | |
|---|---|
| Oil content | 0 (such a trace as to be unmeasurable) |
| Dew point | −50 to −70° C. |
| Conc. of hydrogen | 0.2 to 1.5% |

A strip steel was caused to pass through a weakly reductive atmosphere containing a mixture of a purified nitrogen gas and a hydrogen gas in a vacuum sealing chamber, and a vacuum deposition plating of zinc was carried out.

In the above-mentioned procedure, a concentration of oxygen in the purified nitrogen gas and a temperature of the strip steel were changed to seek for relations of the adhesive strength of the plated metal (zinc) to these factors, and results are shown in FIG. 4. Here, since the influence of the oxygen concentration on the adhesive strength was investigated, no hydrogen was added thereto, and a dew point was −50° C. In FIG. 4, each circular symbol represents a good adhesive strength and each cross symbol represents a poor adhesive strength, the good adhesive strength meaning no appearance of any peeling on the surface of the plated strip steel; the poor adhesive strength meaning the occurrence of peeling thereon under tests in which Scotch tapes were stuck on 180° ot-bent portions of the strip steels.

FIG. 4 indicates that with regard to adhesive strengths of the plated zinc coatings on the strip steels in the case that the vacuum deposition plating was given at the respective strip steel temperatures by mixing no hydrogen gas with the circulating nitrogen gas and by changing the concentrations of oxygen, their good results were obtained at strip steel temperatures of 160° to 250° C. and at the oxygen concentrations of about 10 ppm or less.

When hydrogen was used as much as 0.7% under specified conditions of circulating nitrogen gases (dew point = −50° C.) shown in FIG. 5, the adhesive strength of the zinc coating was good, even when the concentration of oxygen was 60 ppm. That is to say, the results of FIG. 5 indicate that if the weakly reductive atmosphere containing a small amount of the hydrogen gas is prepared, the vacuum plated zinc can have the sufficient adhesive strength, even when the concentration of oxygen is a little too high. The circular and cross symbols in FIG. 5 are as defined above in connection with FIG. 4.

Embodiment 2

A strip steel was plated with zinc under the following conditions in accordance with a vacuum deposition plating method.

| | |
|---|---|
| Thickness of strip steel | 0.6 mm |
| Width of strip steel | 300 mm |
| Feed rate of steel | 20 m/min |
| Annealing furnace: | |
| Furnace pressure: | Atmospheric pressure + 5 mmAg |
| Atmosphere gas: | $H_2 = 75\%$, $N_2 = 25\%$ |
| $N_2$ replacement chamber: | |
| Pressure: | Atmospheric pressure + 4 mmAq |
| Atmosphere gas: | Dew point = −22° C. $H_2 = 0.7\%$, $N_2 = 99.3\%$, $O_2 = 22$ ppm |
| Temperature of strip steel in | about 350 to 400° C. |
| nitrogen replacement chamber: | |
| Temperature of strip steel in vacuum deposition chamber: | 255° C. |

At this time, component properties of the circulating purified gas were as follows:

| | |
|---|---|
| Conc. of oxygen | 3 ppm |
| Dew point | −62° C. |
| Conc. of hydrogen | 0.7% |
| Oil content | 0 ppm |

Vacuum deposition plating was carried out while the surface of the strip steel was kept active in a vacuum sealing chamber.

As a result of the zinc plating under the abovementioned conditions, vacuum zinc plated products having good adhesive properties were obtained. The results are exhibited in FIGS. 6, 7 and 8.

Figure 7:
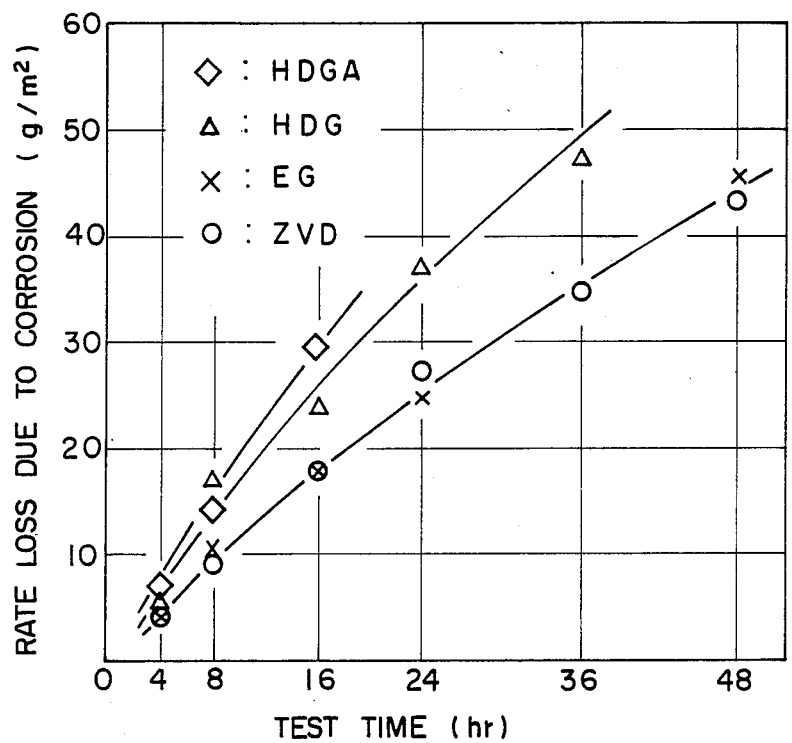
FIG. 7 is a graph showing results of brine spray anti-corrosive tests for zinc plated products according to a variety of plating methods.
Figure 8A:
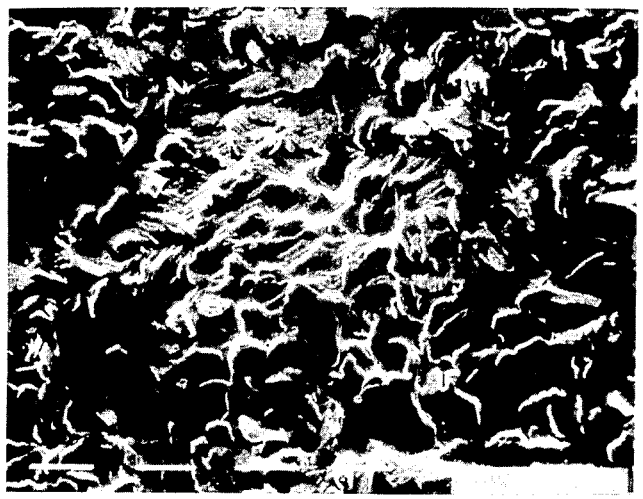
Figure 8A:
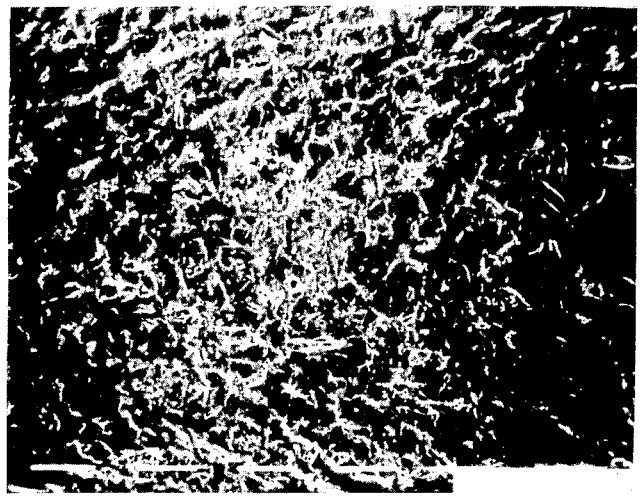
Figure 8B:
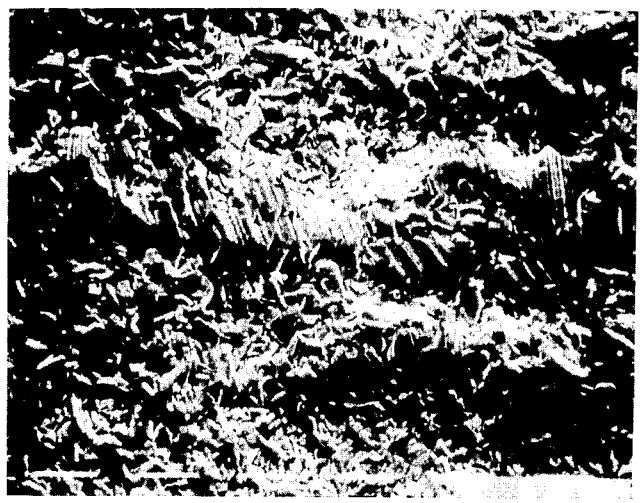
Figure 8B:
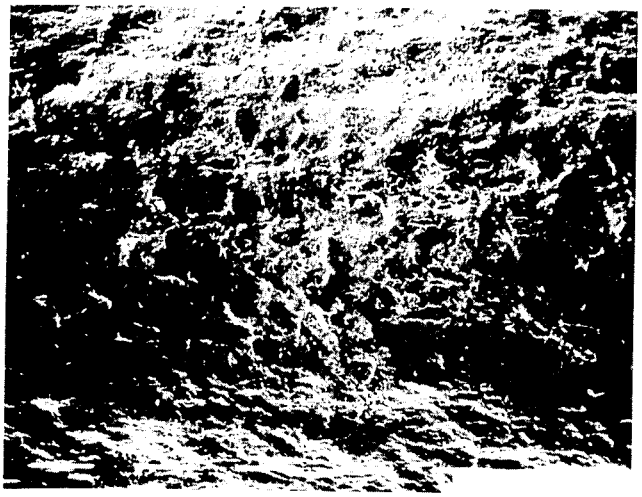
Figure 8C:
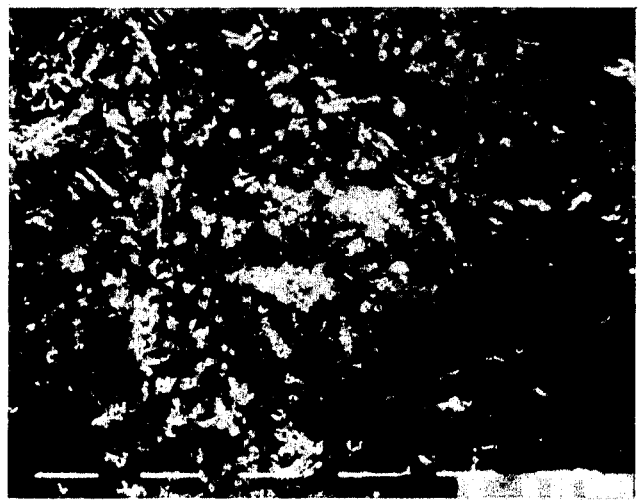
Figure 8C:
Figure 8D:
Figure 8D:
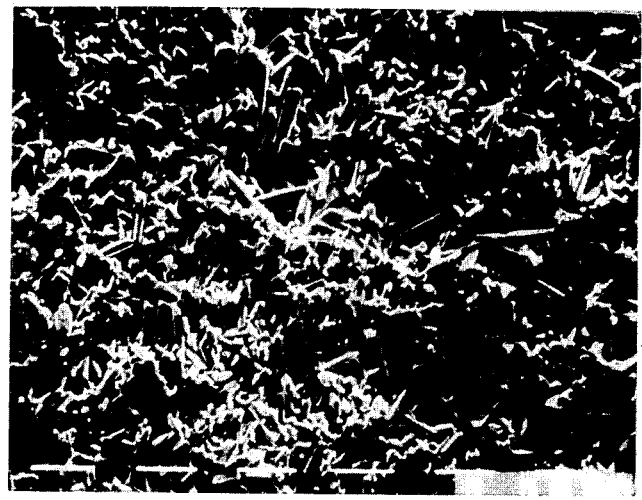

That is to say, FIG. 6 shows the results of brine spray anti-corrosive tests of the vacuum zinc plated coatings at a strip steel temperature of 255° C., and FIG. 7 compares the results of brine spray anti-corrosive tests of products zinc-plated by the vacuum deposition plating method at a strip steel temperature of 255° C. in FIG. 6 and products zinc-plated by other plating methods. It is apparent from FIG. 7 that the products obtained by the deposition plating method were better in anticorrosion than the others. In FIG. 7, the abbreviation "ZVD" (circular symbol) represents the products vacuum-plated according to the present invention (the same as the products represented by the triangular symbol in FIG. 6), "EG" (cross symbol) represents electroplated products, "HDG" (triangular symbol) hot dipped products, and "HDGA" (diamond symbol) products prepared by subjecting the hot dipped products to an alloying treatment.

FIG. 8 shows photomicrographs of the products zinc-plated by the vacuum deposition plating method at the strip steel temperature of 255° C. in FIG. 6 and the products zinc-plated in accordance with the other methods. FIGS. 8 (A)(a) and (A)(b) show the product vacuum-plated according to the present invention (the temperature of the strip steel was 255° C.) (plating amount = 54 g/m²), FIGS. 8 (B)(a) and B(b) show the EG product (plating amount = 18 g/m²), FIGS. 8 (C)(a) and (C)(b) the HDG product (plating amount = 65 g/m²), and FIGS. 8 (D)(a) and (D)(b) the HDGA product (plating amount = 44 g/m²), and the drawings having "(a)" show crystalline structures on the surfaces of the zinc platings, and the other drawings having "(b)" show crystalline structures of the zinc platings in ot-bent portions designated by an arrow in FIG. 9. It is definite from the shown drawings having "(b)" that any crack and the like are not observed on the zinc plated products.

The present invention can provide the following functional effects:

(1) The nitrogen gas discharged from the vacuum chambers by vacuum is not given away immediately in vain, and it is instead guided to the nitrogen purification system and the purified nitrogen gas is the returned to the inlet of the vacuum sealing device again. That is to say, the flow of the nitrogen gas constitutes the closed circulating cycle. In consequence, a consumption of the nitrogen gas is nearly zero, and costs of the vacuum deposition plating can be reduced to a remarkable degree.

(2) An amount of the hydrogen gas is controlled to a level of 0.2 to 2.0% by adding the extra hydrogen gas to the purified nitrogen gas. Therefore, when passing through the vacuum sealing device containing the weakly reductive atmosphere in which the nitrogen gas is mixed with the hydrogen gas, the reduced and activated strip steel surface state provided in the annealing furnace can be retained. As a result, the sufficient adhesive strength of the vacuum plated metal can be assured on the strip steel.

(3) In the apparatus for performing the vacuum deposition plating, the nitrogen replacement chamber is provided between the annealing furnace for annealing and reducing the strip steel and the vacuum sealing device for producing a vacuum, and the sealing rolls are provided at the inlet and the outlet of the nitrogen replacement chamber. Accordingly, the independent chamber is disposed between the annealing furnace and the vacuum sealing device, and this independent chamber is controlled so that a pressure therein may be equal to or a little lower than a pressure in the annealing furnace, whereby the annealing furnace can be effectively connected to the vacuum sealing device and the efficient vacuum deposition plating can be achieved.

Further, in the present invention, a pressure in the nitrogen replacement chamber is regulated to a slightly lower level (for example, a differential pressure of about 1 mmAq) than that in the annealing furnace, which fact allows the atmosphere gas ($H_2=5$ to 75%, $N_2=95$ to 25%) in the annealing furnace to flow into the nitrogen replacement chamber, whereby the concentration of hydrogen in the atmosphere gas in the nitrogen replacement chamber can be regulated to a level of 0.2 to 2.0% which is weakly reductive. As a result, the vacuum deposition plating can be carried out in the deposition chamber while the activated strip steel surface state provided in the annealing furnace can be maintained, and thus the plated metal can have a good adhesive strength.

What is claimed is:

1. A method for vacuum deposition plating steel strip which comprises using a vacuum deposition plating apparatus having an inlet-side vacuum sealing device provided in front of a vacuum deposition plating chamber, an inlet-side inactive gas replacement chamber provided between said inlet-side vacuum sealing device and an annealing furnace with an atmosphere including hydrogen, an outlet-side vacuum sealing device provided in the rear of said vacuum deposition plating chamber, an outlet-side inactive gas replacement chamber provided between said outlet-side vacuum sealing device and the atmosphere, and an inactive gas circulating/purifying device for circulating an inactive gas from vacuum chambers of said both vacuum sealing devices to atmospheric pressure chambers of said both vacuum sealing devices and for removing water, oil and oxygen from said inactive gas, said method for vacuum deposition plating being characterized by regulating concentrations of oxygen and hydrogen in said inactive gas after the purification to 60 ppm or less of oxygen and 0.2 to 2.0% of hydrogen, and regulating the dew point of said inactive gas to $-50°$ C. or less.

2. A method for vacuum deposition plating steel strip which comprises using a vacuum deposition plating apparatus having an inlet-side vacuum sealing device provided in front of a vacuum deposition plating chamber, an inlet-side inactive gas replacement chamber provided between said inlet-side vacuum sealing device and an annealing furnace with an atmosphere including hydrogen, an outlet-side vacuum sealing device provided in the rear of said vacuum deposition plating chamber, an outlet-side inactive gas replacement chamber provided between said outlet-side vacuum sealing device and the atmosphere, and an inactive gas circulating/purifying device for circulating an inactive gas from vacuum chambers of said both vacuum sealing devices to atmospheric pressure chambers of said both vacuum sealing devices and for removing water, oil and oxygen from said inactive gas, the aforesaid method for vacuum deposition plating being characterized by regulating a pressure $P_1$ in said annealing furnace to atmospheric pressure or more, a pressure $P_2$ in said inlet-side inactive gas replacement chamber to atmospheric pressure or more, a pressure $P_3$ in said outlet-side inactive gas replacement chamber to atmospheric pressure or more, a value of $P_1-P_2$ to 0 mmAq or more, and a concentration of hydrogen in said inlet-side inactive gas replacement to 2.0% or less.

* * * * *